United States Patent
Bengtsson et al.

(10) Patent No.: US 11,984,413 B2
(45) Date of Patent: May 14, 2024

(54) HIGH-FREQUENCY POWER TRANSISTOR AND HIGH-FREQUENCY POWER AMPLIFIER

(71) Applicant: FERDINAND-BRAUN-INSTITUT GGMBH, LEIBNIZ-INSTITUT FÜR HÖCHSTFREQUENZTECHNIK, Berlin (DE)

(72) Inventors: Olof Bengtsson, Berlin (DE); Sophie Paul, Berlin (DE); Tobias Kuremyr, Uppsala (SE)

(73) Assignee: FERDINAND-BRAUN-INSTITUT GGMBH, LEIBNIZ-INSTITUT FÜR HÖCHSTFREQUENZTECHNIK, Berlin (DE)

( * ) Notice: Subject to any disclaimer, the term of this patent is extended or adjusted under 35 U.S.C. 154(b) by 444 days.

(21) Appl. No.: 17/299,835

(22) PCT Filed: Nov. 12, 2019

(86) PCT No.: PCT/EP2019/081064
§ 371 (c)(1),
(2) Date: Jun. 4, 2021

(87) PCT Pub. No.: WO2020/114731
PCT Pub. Date: Jun. 11, 2020

(65) Prior Publication Data
US 2022/0028807 A1    Jan. 27, 2022

(30) Foreign Application Priority Data
Dec. 5, 2018   (DE) .................. 10 2018 131 040.4

(51) Int. Cl.
*H03F 3/14* (2006.01)
*H01L 23/66* (2006.01)
(Continued)

(52) U.S. Cl.
CPC ............ *H01L 23/66* (2013.01); *H03F 1/0211* (2013.01); *H03F 3/195* (2013.01);
(Continued)

(58) Field of Classification Search
CPC ............. H01L 23/66; H01L 2223/6611; H01L 2223/6655; H01L 2223/6683;
(Continued)

(56) References Cited

U.S. PATENT DOCUMENTS 4,298,846 A * 11/1981 Hirano ................. H01L 23/66
333/32
4,788,584 A * 11/1988 Hirano ................. H01L 23/66
257/E23.006
(Continued)

FOREIGN PATENT DOCUMENTS

| JP | H01-165149 A | 6/1989 |
|----|--------------|--------|
| JP | 2001-06887 A | 1/2001 |

(Continued)

OTHER PUBLICATIONS

International Search Report dated Jan. 31, 2020, issued in connection with PCT International Application No. PCT/EP2019/081064.
(Continued)

*Primary Examiner* — Khanh V Nguyen
(74) *Attorney, Agent, or Firm* — Norris McLaughlin, P.A.

(57) ABSTRACT

A high-frequency power transistor comprises a transistor, at least one capacitor and a housing, which at least partially encloses the transistor and the capacitor. A first port for a high-frequency input and a gate DC voltage supply are connected to a gate contact of the transistor. A second port is connected to a drain contact of the transistor for a high-frequency output and drain DC voltage supply. A third port and fourth port are connected to a source contact of the transistor. All ports lead out of the same housing. The third
(Continued)

port is connected via the capacitor to the source contact, and the fourth port is connected via at least one inductive element to the source contact, so that the third port provides a high-frequency ground, and the fourth port provides a floating low-frequency ground and source DC voltage supply.

11 Claims, 14 Drawing Sheets

(51) Int. Cl.
      *H03F 1/02*            (2006.01)
      *H03F 3/195*         (2006.01)

(52) U.S. Cl.
      CPC ............... *H01L 2223/6611* (2013.01); *H01L 2223/6655* (2013.01); *H01L 2223/6683* (2013.01); *H01L 2924/3011* (2013.01)

(58) Field of Classification Search
      CPC .......... H01L 2924/3011; H03F 1/0211; H03F 3/195; H03F 1/56; H03F 3/14; H05K 1/0237
      See application file for complete search history.

(56) References Cited

U.S. PATENT DOCUMENTS

| | | | |
|---|---|---|---|
| 5,841,184 A | 11/1998 | Li | |
| 5,874,859 A * | 2/1999 | Amachi | ............ H01L 27/0629 257/E27.012 |
| 6,147,455 A | 11/2000 | Nerone | |
| 6,593,797 B1 * | 7/2003 | Sowlati | ................... H03F 3/19 327/310 |
| 6,734,728 B1 | 5/2004 | Leighton et al. | |
| 6,897,732 B2 * | 5/2005 | Iwai | .................. H03F 1/0266 330/296 |
| 8,358,235 B2 | 1/2013 | Yuanzhu | |
| 2011/0057829 A1 | 3/2011 | Yuanzhu | |
| 2011/0080226 A1 * | 4/2011 | Yamakawa | ......... H03B 5/1203 331/177 V |
| 2011/0221519 A1 | 9/2011 | Katoh et al. | |
| 2018/0262170 A1 | 9/2018 | Gorbachov et al. | |

FOREIGN PATENT DOCUMENTS

| | | |
|---|---|---|
| JP | 2007-228094 A | 9/2007 |
| JP | 2007-234905 A | 9/2007 |
| JP | 2011-058836 A | 3/2011 |
| WO | 99/40629 A1 | 8/1999 |
| WO | 2014/170710 A1 | 10/2014 |

OTHER PUBLICATIONS

English translation International Search Report dated Jan. 31, 2020, issued in connection with PCT International Application No. PCT/EP2019/081064.

Written Opinion issued in connection with PCT International Application No. PCT/EP2019/081064.

\* cited by examiner

HIGH-FREQUENCY POWER TRANSISTOR AND HIGH-FREQUENCY POWER AMPLIFIER

This application is the U.S. National Stage of International Application No. PCT/EP2019/081064, filed Nov. 12, 2019, which claims foreign priority benefit under 35 U.S.C. § 119 of German Application No. 10 2018 131 040.4, filed Dec. 5, 2018, the disclosures of which are incorporated herein by reference.

The invention relates to a high-frequency power transistor, and in particular the invention relates to the separation of high-frequency and direct current or low-frequency ground inside of the power transistor housing. The operation of a high-frequency (HF) power transistor with a floating ground is enabled by inserting an HF bypass capacitor into the transistor housing. The capacitor produces a separation of the HF ground from the DC (English direct current, German Gleichstrom) and low-frequency (LF) ground. By placing the HF bypass capacitor in the housing and as close as possible to the transistor, the inductivity of the HF path between the source contact of the transistor and the system ground can be reduced. This improves the efficiency, the DC & LF/HF insulation, and hence also the LF bandwidth and stability. A separate DC & LF port on the housing enables floating operation at a high LF bandwidth (English video bandwidth), wherein the achievable bandwidth of about 10 MHz is increased to several hundred MHz.

TECHNOLOGICAL BACKGROUND OF THE INVENTION

High-frequency (HF) power amplifiers are known to be key components in wireless communication systems. They amplify HF signals to power levels required for transmission over a specific distance. In order to allow data transmission with high data rates or large bandwidths, complex modulation schemes are applied to the HF signal, which lead to a varying signal power.

In light of the fact that energy consumption and energy savings are critical aspects when it comes to HF power amplifiers, it is important that HF power amplifiers be operated in an energy-efficient mode. In linear HF power amplifiers, the efficiency is highest in the maximum power range, and tapers off at a reduced output power, i.e., during power backoff.

One approach to increasing HF power amplifier efficiency during power backoff involves the envelope tracking technique (English: envelope tracking technique, ET technique), in which the supply voltage of the HF power amplifier is adjusted according to the instantaneous power of the modulated HF signal. As a consequence, the ET technique reduces the power consumption, and hence the power loss, of a HF power amplifier.

The extreme bandwidth of modern communication signals requires a very fast envelope amplifier, i.e., a DC converter can supply the HF power amplifier with a voltage corresponding to the instantaneous change in power in the HF signal. All such fast DC converters have a kind of switching stage.

In the simplest form, the DC converter can be a downconverter, which feeds a load, which for an ET system that uses an ET technique is the HF power amplifier. In this topology, the HF power amplifier is connected with the ground, meaning that the downconverter works in the direction of the ET system supply voltage, wherein the HF power amplifier is supplied by the floating downconverter output. This requires either a p-channel field effect transistor or an n-channel field effect transistor with insulated switch driver.

While novel ultrafast compound semiconductors are very well suited for switching applications due to their low parasitic capacitances, only n-type material is available with a high power and switching speed. A downconverter with such an n-channel field effect transistor is a very promising topology with respect to switching frequency and load capacity. However, the aforementioned insulated gate switch is complicated to implement, and leads to a parasitic capacitance that influences the switching behavior, and has a big influence on the overall ET system properties.

In order to prevent this, WO 2014/170710 A1 proposes an envelope tracking system with an inverted downconverter. The proposed topology is unusual in the sense that the supply voltage of the HF power amplifier is modified by varying the low-frequency (LF) source potential of the HF power amplifier transistor, while keeping the system ground and HF ground together. As a consequence, the HF power amplifier is floating in relation to the DC voltage supply, or in this case in relation to the LF source potential. In such an ET system utilizing an inverted downconverter, the HF power amplifier comprises the load of the downconverter, but is supplied with a floating ground from the voltage drop between the supply voltage of the ET system and the output of the downconverter.

Additional conventional power transistors are disclosed in U.S. Pat. No. 6,593,797 B1, U.S. Pat. No. 6,734,728 B1, US 2018/0262170 A2 and U.S. Pat. No. 5,841,184 A.

As shown on FIGS. 1A, 1B and 1C, HF power transistors that deliver 10 W or more power and constitute core elements of such power amplifiers are typically used as separate components built into a respective housing. The HF power transistor housing shown on FIGS. 1A and 1C comprises a flange with a high electrical and thermal conductivity, an electrically insulating frame placed thereupon, which insulates the two electrical connections in turn placed thereupon from the flange, as well as an electrically insulating cover, which protects the contents of the housing. The transistor contained in the housing (together with additionally required components) is placed on the flange inside of the electrically insulating frame. In the housed transistor shown on FIG. 1C, which can be either a field effect (FET) or bipolar (BJT) transistor, bond wires are used to connect the input port with the gate contact of the FET (or the base contact of a BJT), the drain contact of the FET (or emitter contact of a BJT) with the output port, as well as the source contact of the FET (or collector contact of a BJT) with the system ground. Since the depicted transistor chip involves a transistor without vias, electrically conductive bond bases are placed near the transistor, which are connected directly with the system ground via the flange of the power transistor housing. As shown on FIG. 1D, the housed transistor from FIGS. 1A, 1B and 1C can comprise an input matching network, which connects the input port with the gate contact of the FET (or the base contact of a BJT), and/or an output network, which connects the drain contact of the FET (or emitter contact of a BJT) with the output port.

As shown on FIG. 2A, the housed transistor is typically built into a printed circuit board. Also located on this printed circuit board are matching networks and DC & LF/HF diplexers, which connect the output port of the transistor with the HF output. A DC & LF power supply is connected via a DC & LF supply line with the describe diplexer, and thus with the output matching network and the output port of the transistor. This dual function of the circuit on the printed circuit board produces the targeted impedance matching at the carrier frequency, and at the same time provides a path for supplying the DC supply voltage for the transistor. In addition, the circuit must separate the DC & LF supply from the HF output, and suppress a coupling of the HF signal in the supply path.

To enable the floating operation of the typical HF power transistor, the HF ground must be separated from the DC & LF ground outside of the transistor housing. As shown on FIG. 2B, this can be done by additionally introducing a DC & LF/HF diplexer into the circuit on the printed circuit board. The ground connection of the transistor, meaning the flange, is then connected via a HF bypass network with the system ground, and via a DC & LF lowpass network with the floating DC & LF port. The gate of the transistor must be actuated via a galvanically separated power supply for purposes of floating operation.

The distance between the transistor and the switching parts relevant for ground separation is a disadvantage to this possible realization, since the additional line lengths generate additional inductances and electrical delays. Combined with the capacitors required on the printed circuit board for the HF bypass, the LF bandwidth is thus limited.

Alternatively, the floating operation of mere HF power transistor without a vias and without a housing can be realized with a hybrid structure, in which the ground separation between the HF or DC & LF is generated by a bondable bypass capacitor placed right next to the transistor chip on the flange, whose upper electrode is connected by bond wires with the source contact of the transistor, and whose lower electrode is directly contacted with the flange. Furthermore, the source contact of the transistor is connected via bond wires with the DC & LF lowpass network and the accompanying floating ground on the surrounding printed circuit board. The gate and drain contacts of the transistor are likewise connected via bond wires with the input and output networks on the surrounding printed circuit board, which corresponds to bonding to the input and output ports in a typical HF power transistor housing.

The known solutions have the following problems:

(1) There is no precisely defined interface between the floating transistor and the surrounding networks. This means that:
   a. It is impossible to correctly characterize the power and stability of the floating transistor together with the bondable capacitor.
   b. No HF model other than for the individual cells of the transistor can be extracted for simulations.
   c. The predictability of the HF power amplifier behavior, and thus of the overall ET system, is not good.

(2) The mechanical structure of a circuit with a mere transistor chip and bondable capacitor bondable capacitor is very complicated, and the assembled circuit is not protected against mechanical damage. This means that:
   a. Simple and quick designs are not possible from a mechanical standpoint.
   b. The HF power amplifier with bonded transistor chip and capacitor is susceptible to mechanical damage. At the same time, it is difficult to effect repairs given mechanical or electrical damage to the transistor, and only a few repairs are even possible at all.

SUMMARY OF THE INVENTION

The object is to provide a high-frequency power transistor that overcomes at least part of the disadvantages mentioned above.

Introduced according to the invention is a high-frequency power transistor comprising:
   a transistor,
   at least one capacitor,
   a housing that at least partially surrounds the transistor and the capacitor, wherein a first port for a high-frequency input and a gate DC supply is connected to a gate contact of the transistor,
   characterized in that
   a second port is connected to a drain contact of the transistor for a high-frequency output and drain DC voltage supply and
   wherein a third port and a fourth port are connected to a source contact of the transistor, and wherein the first, second, third and fourth all lead out of the housing, and
   wherein the third port is connected via the capacitor to the source contact, and the fourth port is connected via at least one inductive element to the source contact, so that the third port provides a high-frequency ground, and the fourth port provides a floating DC & LF ground and source supply.

Low frequency (LF) is normally understood as longwave radiation with 30 kHz to 300 kHz. LF is here to be understood as a general designation that comprises radiation with the modulation frequency (MF) or in the baseband in the frequency range of DC (0 Hz) to several hundred megahertz, more preferably of up to 400 MHz. High frequency (HF) is normally understood as shortwave radiation with 3 MHz to 30 MHz. HF is here to be understood as a general designation that comprises radiation in a range of 500 MHz to several GHz, more preferably to 5 GHz, and even more preferably to 10 GHz. The upper LF limit depends on the HF carrier frequency, and with the proposed solution can reach up to 20% of the HF carrier frequency, and can more preferably reach up to 40% of the HF carrier frequency. Taking into account the described ratio between LF and HF, a LF of preferably 4 GHz can be achieved at a preferred HF of 10 GHz.

The resistance between the source contact of the transistor and the capacitor is preferably less than 1 Ohm, more preferably less than 0.5 Ohm, and even more preferably less than 10 mOhm.

The inductance between the source contact of the transistor and the system ground is preferably less than 0.8 nH, more preferably less than 0.1 nH, and even more preferably less than 10 pH.

A floating ground is preferably a ground internal to the device without any reference to the earth.

Galvanic separation (also galvanic decoupling) is preferably understood as avoiding an electrical line between two power circuits, between which power or signals are to be exchanged. The electrical line is here disconnected via electrically nonconductive coupling elements. In a galvanic separation, the electrical potentials are separated from each other, and the power circuits are then floating relative to each other.

A bypass network is preferably understood as one or several bypass capacitors. A bypass capacitor is also referred to as a leading capacitor, short-circuit capacitor or by-pass capacitor. Generally involved is a capacitor intended to provide a bypass or diversion route for specific signals or interference signals.

A duplexer preferably refers to an electrically passive assembly in the area of high-frequency technology with three gates, which as a function of frequency serves to separate a guided electromagnetic wave between two gates or combine them on one gate in the reverse operating direction. The diplexer constitutes a special design for a crossover.

A lowpass network is preferably understood as one or several lowpass filters. A lowpass filter is a filter that only allows through frequencies up to a certain frequency level. Above the latter, it becomes a blocking filter.

A matching network is preferably understood as a circuit for adjusting the impedance between a source for high-frequency signals and a consumer. This optimizes the power transmission between the source and consumer.

A λ/4 line is preferably a transmission line for guiding electromagnetic waves in the form of a coplanar or microstrip line, whose length measures one fourth of the wavelength of the electromagnetic wave to be transmitted, and thus induces a transformation of a HF short circuit into a HF open circuit and vice versa.

The HF power transistor housing preferably comprises a flange with a high electrical and thermal conductance, an electrically insulating frame placed thereupon, which insulates the two electrical ports in turn placed thereupon from the flange, as well as an electrically insulating cover, which protects the contents of the housing.

The proposed HF power transistor thus has separate low-frequency and high-frequency grounds, so as to enable a readily predictable HF power amplifier design with a floating low-frequency ground. Conventionally housed HF power transistors have three ports, i.e., one for the HF input signal and the DC gate supply, a second for the HF output signal and the DC drain supply, or in an ET system also for the NF train supply, and a third for the shared ground.

The power transistor with floating ground according to the invention has four or more ports. The ports for the HF input signal and the DC voltage gate supply as well as for the HF output signal and the DC current drain supply are the same as for conventional housed HF power transistors.

The difference for the HF power transistor according to the invention lies in the fact that the port for the conventional shared ground of HF and DC & LF now only serves as an HF ground. The port for the floating DC & LF ground is realized by at least one additional port (at least the fourth port). For this reason, at least four ports leading out of the housing are required.

For example, in the HF power transistor with floating LF ground according to the invention, the LF and HF grounds are separated by coupling the HF signal to the system ground via a capacitor with a sufficient series resonant frequency, which preferably provides an HF short circuit and DC & LF open circuit. The bandwidth of the HF short circuit depends mainly on the quality factor of the capacitor The transistor is installed into the housing in parallel together with a (bondable) capacitor or a number of capacitors. This solution is practicable as long as the housing is large enough to accommodate both the transistor and the capacitor(s), and not too large to set a boundary, for example for the parasitic inductances of connecting bond wires, which represent the inductive element. In particular, any used bond wires between the source contact of the transistor and the capacitor have a significant influence on the HF short circuit.

The power transistor according to the invention enables:

(1)—a separate characterization and modeling of the housed (i.e., housing-enclosed), ground-separated HF power transistor on a fixed interface, i.e., the at least four ports leading out of the housing;

(2)—a simple and rapid HF power amplifier design by using the HF power transistor according to the invention as a conventionally housed HF power transistor with only at least one additional port for the LF ground, without any special equipment and knowledge being required for assembly;

(3)—protection against mechanical damages by a cover as part of the housing;

(4)—simple and rapid repair of an HF power amplifier with damaged transistor via the simple replacement of the housed, damaged transistor with a new transistor.

The power transistor housing preferably comprises a flange with a high electrical and thermal conductance, preferably an electrically insulating frame placed thereupon, which insulates the two electrical ports in turn preferably placed thereupon from the flange, as well as preferably an electrically insulating cover, which protects the contents of the housing.

The feature "lead out of the housing" in reference to the ports must be construed to mean that an electrical connection is enabled with an external port or a ground for the respective port of the at least four ports.

Within the framework of this application, the term transistor by itself relates only to the transistor as a single switching element in the power transistor according to the invention, wherein the latter also comprises the capacitor and the housing, for example. Within the framework of this application, the term capacitor is broadly construed, and can also represent another switching element that assumes its functionality.

In a preferred embodiment, the inductive element comprises a bond wire or several bond wires connected in parallel. The inductive element preferably comprises a plurality of bond wires. The length and number of bond wires depends on the distance to be bridged between the transistor and the elements or ports to be connected and the required current carrying capacity, and can also be varied according to the desired inductance of the inductive element.

In another preferred embodiment, the capacitor is a single-layer capacitor. The DC & LF/HF frequency separation on the source contact of the transistor is then achieved by at least one, preferably bondable, single-layer capacitor with a corresponding capacitance and series resonant frequency. The capacitor is preferably bonded as close as possible to the source contact of the transistor, which provides a HF short circuit to the system ground.

The high-frequency power transistor preferably comprises at least two capacitors connected in parallel between the third port and the source contact.

It is preferred that the transistor and the capacitor be combined into an integrated power circuit, more preferably into an MMIC (English: monolithic microwave integrated circuit, German: monolitisch integrierte Mikrowellenschaltung). An MMIC is a special class of integrated power circuits in high-frequency technology. All active and passive components are here realized on a semiconductor substrate (thickness preferably between 50 µm and 350 µm). Miniaturization allows circuits until into the millimeter wave range. The transistor and the capacitor, via which the connection to the HF ground (in particular to the system ground) takes place, are then both realized inside the same integrated power circuit (MMIC). Therefore, the MMIC functionally comprises the transistor and the capacitor, and is at least partially enclosed by the housing. In this case, an inductive element (in particular bond wires) is also used to connect the MMIC at least with the fourth port, but the properties of the HF short circuit are determined by the MMIC structure (which assumes or comprises the function of the capacitor), and therefore not dependent on the assembly in the housing.

In another preferred embodiment, the third port is connected with at least one electrically conductive flange, preferably with two electrically conductive flanges lying one opposite the other. This facilitates a connection with a system ground (for example via a contacted heat exchanger).

It is preferred that the high-frequency power transistor comprise a fifth port, which is connected by at least one inductive element to the source contact, so that the third port provides a high-frequency ground, and the fourth port and the fifth port together provide a floating low-frequency ground and source DC voltage supply.

The task specified above is also resolved by a high-frequency power transistor according to one of the above embodiments and two printed circuit boards arranged on opposing sides of the high-frequency power transistor.

The first port is preferably connected to a conductor path of the first printed circuit board, wherein the second port, the fourth port, and possibly the fifth port, are connected to conductor paths of the second printed circuit board. The conductor paths of the printed circuit boards then provide the external connections for the first, second, fourth and possibly the fifth port (or more). A printed circuit board preferably provides an input matching network, and the second an output matching network.

In another embodiment, a common printed circuit board preferably comprises an input matching network and an output matching network.

It is preferred that the third port, preferably by means of at least one flange, be connected to a heatsink of the high-frequency power amplifier, which defines the system ground for the high-frequency power amplifier. This makes it possible to both define the HF ground via the system ground, and to provide the mechanical and thermal connection of the power transistor to the system.

BRIEF DESCRIPTION OF THE FIGURES

The properties, features and advantages of this invention described above, along with the way in which they are achieved, will be made more clearly and distinctly understandable in conjunction with the following description of the exemplary embodiments, which are described in greater detail in conjunction with the drawings. Shown on.

DETAILED DESCRIPTION OF THE INVENTION

Figure 2A:
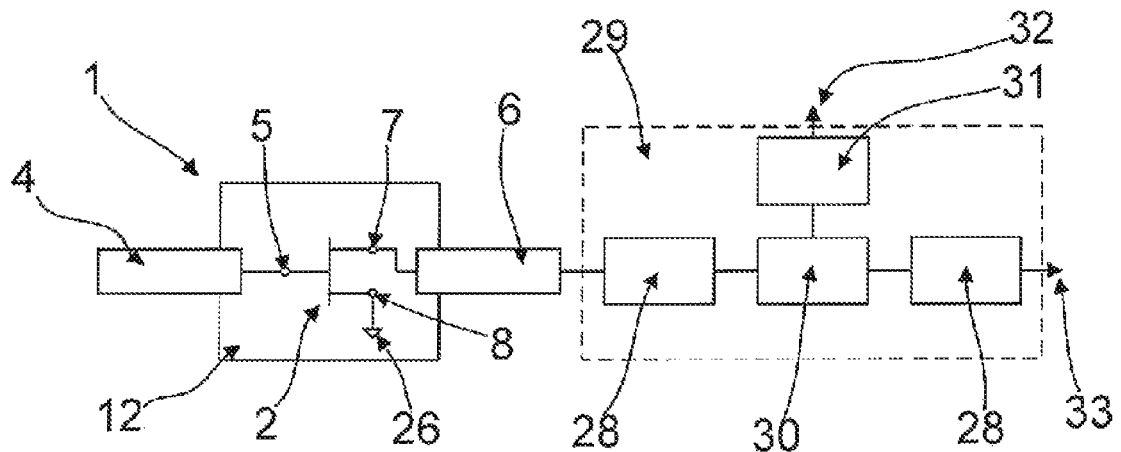
FIG. 2A is a block diagram of the housed HF power transistor from FIG. 1B, connected with a printed circuit board which, according to prior art, contains matching networks as well as the DC&NF/HF diplexer with connected supply network.
Figure 2B:
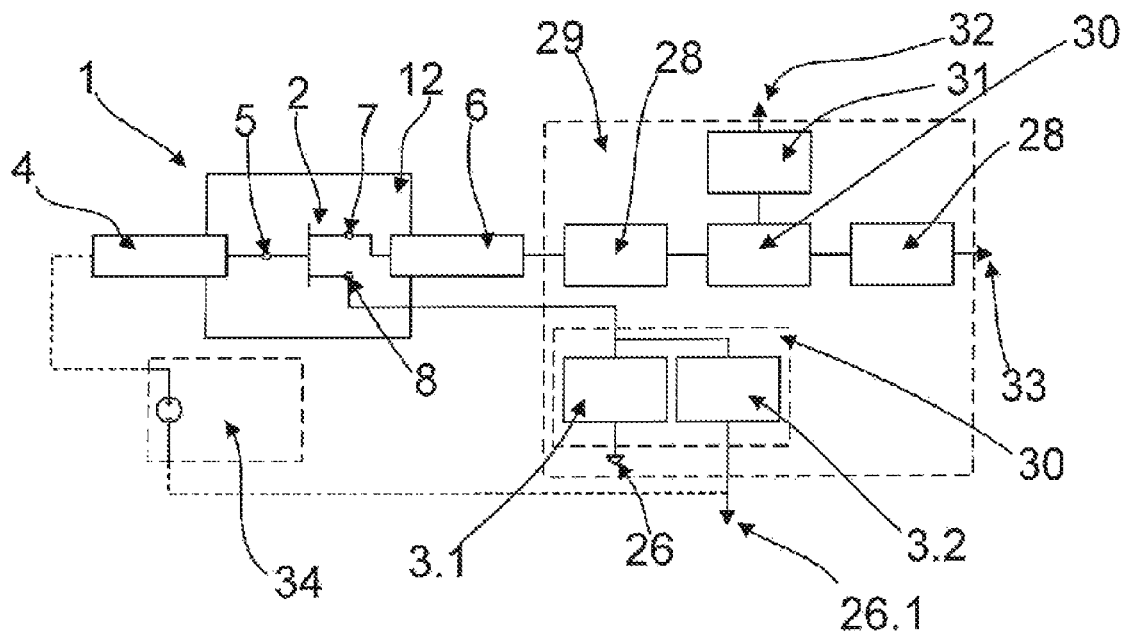
FIG. 2B is a block diagram of the housed HF power transistor from FIG. 1B, connected with a printed circuit board which, according to prior art, contains matching networks, the DC&NF/HF diplexer with connected supply network for transistor drain supply, as well as other circuit parts required for floating operation.
Figure 3A:
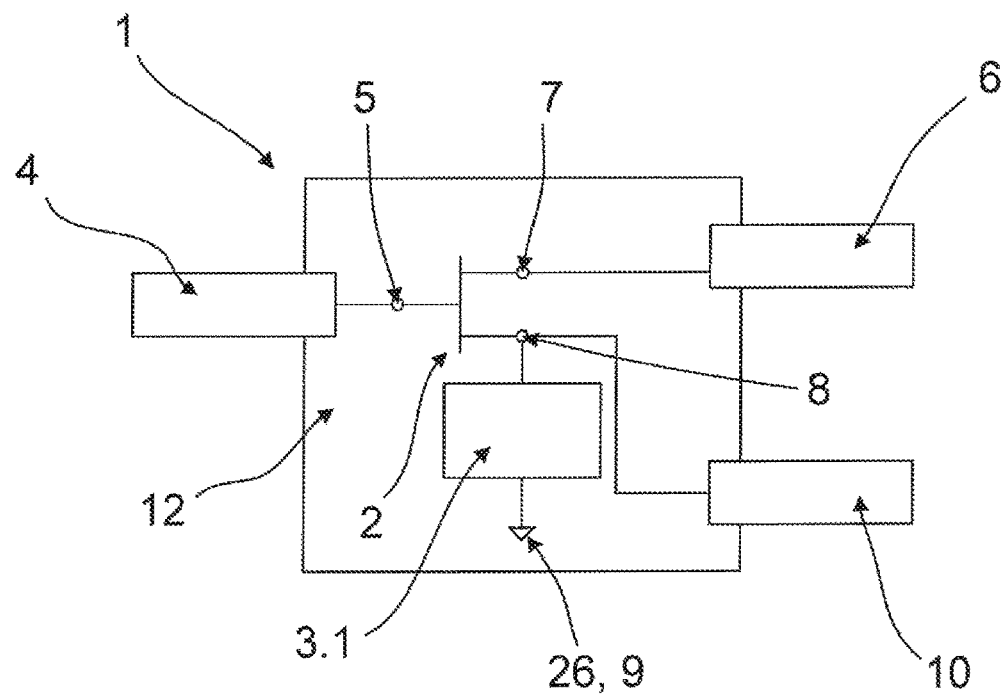
FIG. 3A is a block diagram of an embodiment of the housed HF power transistor according to the invention with internal HF bypass network to the system ground.
Figure 3B:
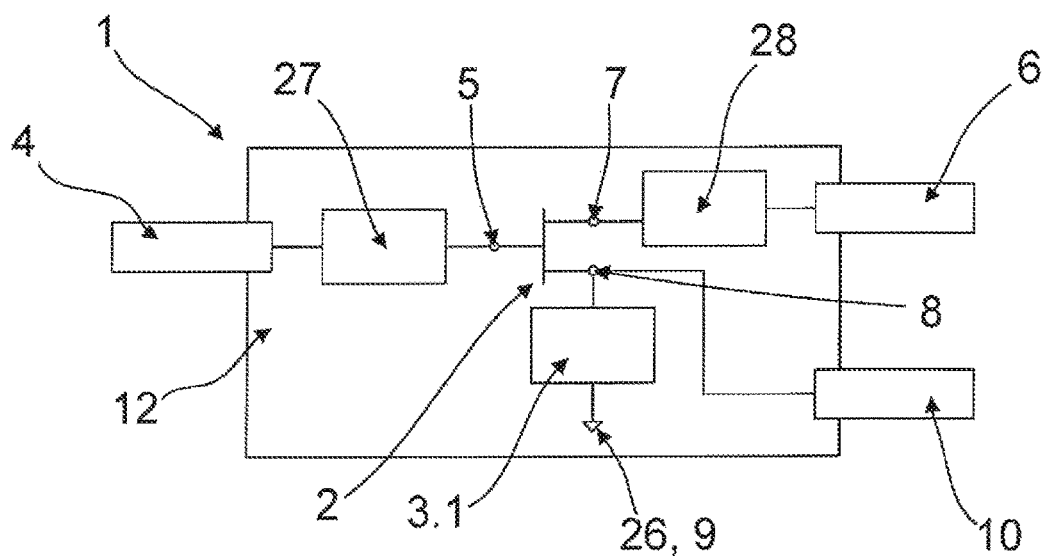
FIG. 3B is a block diagram of another embodiment of the HF power transistor according to the invention with internal HF bypass network to the system ground, as well as integrated input and output matching networks.

FIGS. 3A and 3B show block diagrams of two inventive embodiments of the HF power transistor 1 with or without matching networks 27, 28 and with an HF bypass network 3.1 to the system ground 26. Function blocks with the same designations on both figures are similar. An HF power transistor 1 is mounted in a housing 12 on FIGS. 3A and 3B. A field effect transistor 2 (FET) is depicted on both figures. As already mentioned, however, a bipolar transistor (BJT) can also be used instead. In addition, several transistors instead of just one transistor 2 can be mounted in the housing 12 and connected in parallel. According to prior art, the gate contact of the FET is connected with the input port 4, either directly or via the input matching network 27. Likewise according to prior art, the drain contact 7 of the FET 2 is connected with the output port 6, either directly or via the output matching network 28. Contrary to prior art, the source contact 8 of the FET 2 is not directly connected with the system ground 26. Instead, it is connected via an HF bypass network 3.1 with the system ground 26, which represents the HF ground 9, 26, and connected via an additional connection with the DC & LF ground port 10. In both embodiments, the HF bypass network 3.1 is realized by means of a capacitor 3 connected to system ground 26. The connection with the DC & LF ground port 10 is achieved by wire bonds. The functionality of the DC & LF/HF diplexer 30 is completed by a DC & LF lowpass network 3.2 located on the printed circuit board. In the circuit for floating operation on FIG. 2B, which corresponds to prior art, the HF bypass network 3.1 is placed on the printed circuit board 29 outside of the transistor housing 12, as a result of which a certain distance to the actual transistor 2 arises. As already mentioned, the HF ground connection 9, 26 inside of the housing 12 facilitates the design of an HF power transistor 1, and increases the bandwidth of the HF bypass network 3.1, and hence also the linearity of the transistor circuit for broadband signals.

Figure 4A:
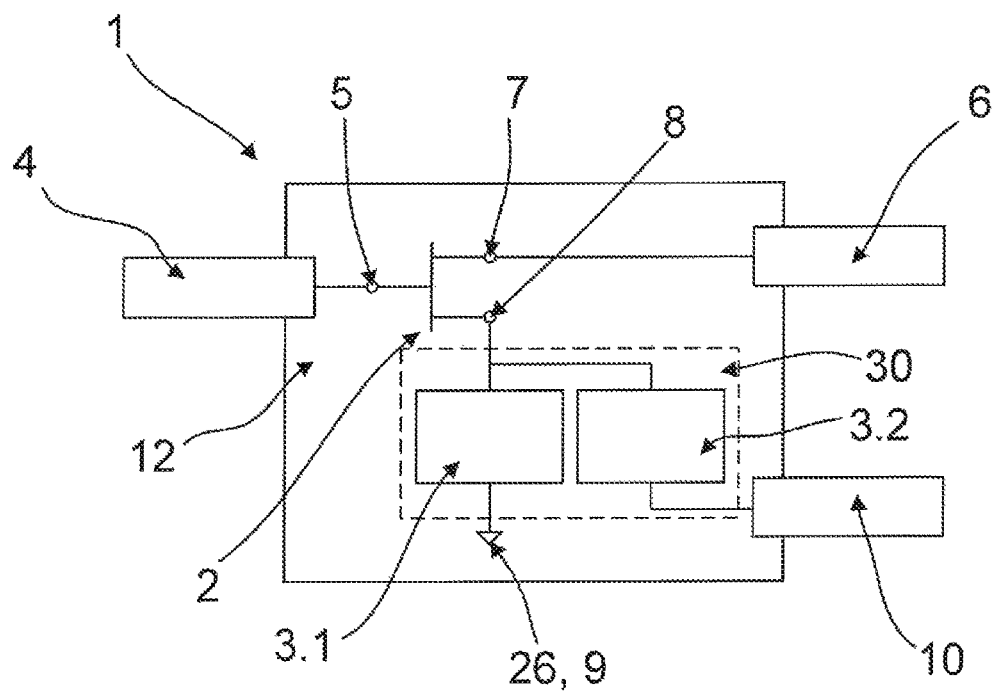
FIG. 4A is a block diagram of another embodiment according to the invention of the housed HF power transistor with internal HF bypass network to the system ground and internal DC & LF lowpass network to the DC & LF ground port.
Figure 4B:
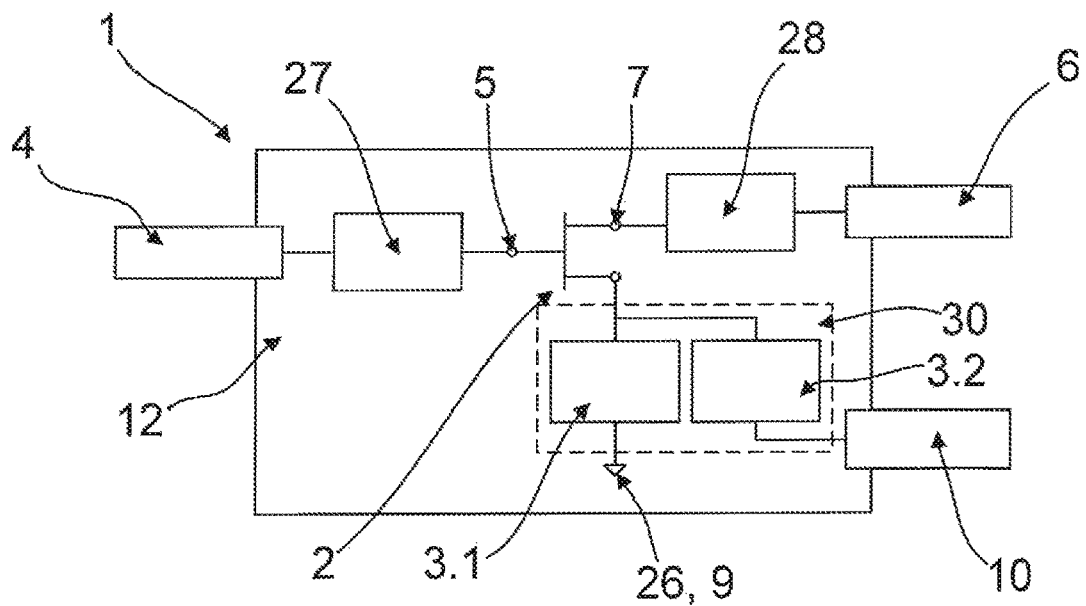
FIG. 4B is a block diagram of another embodiment of the housed HF power transistor according to the invention with internal HF bypass network to the system ground and internal DC & LF lowpass network to the DC & LF ground port, as well as integrated input and output matching networks.

The block diagrams on FIGS. 4A and 4B are similar to those on FIGS. 3A and 3B, except for an additional DC and LF lowpass network 3.2, which is inserted between the source contact 8 of the FET 2 and the DC & LF ground port 10, 26.1 so as to improve the HF insulation and LF bandwidth of the transistor 2. As a consequence, the functionality of the DC & LF/HF diplexer is realized completely inside of the transistor housing 12.

Figure 5A:
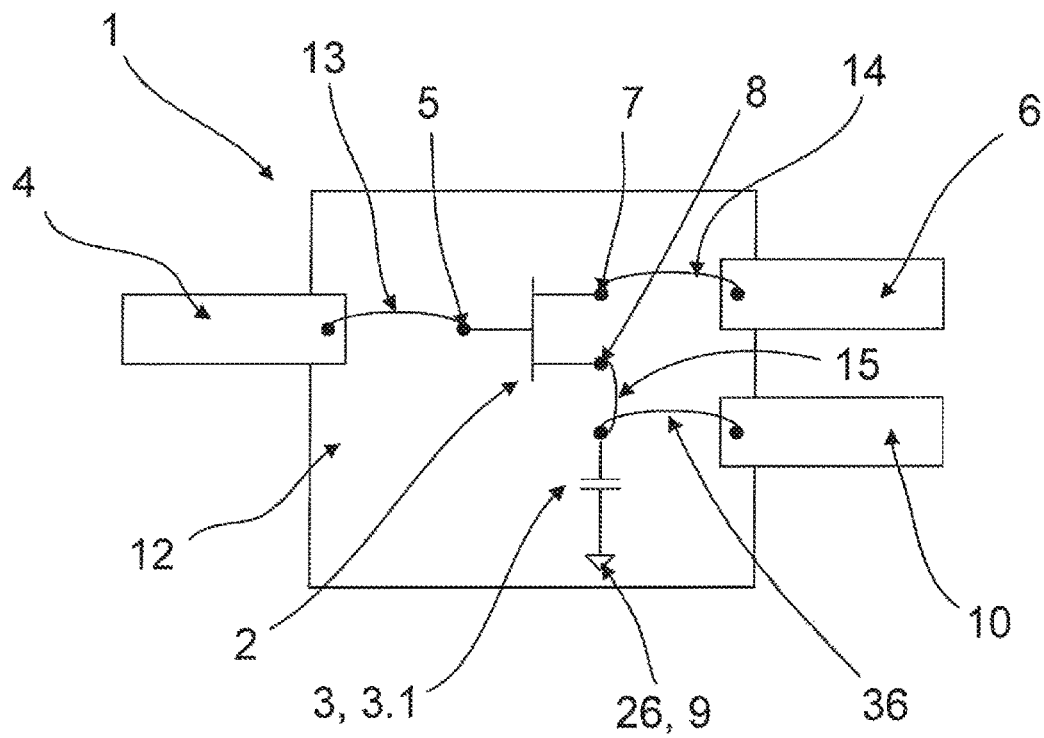
FIG. 5A is a physical equivalent circuit diagram of an embodiment of the HF power transistor according to the invention.
Figure 5B:
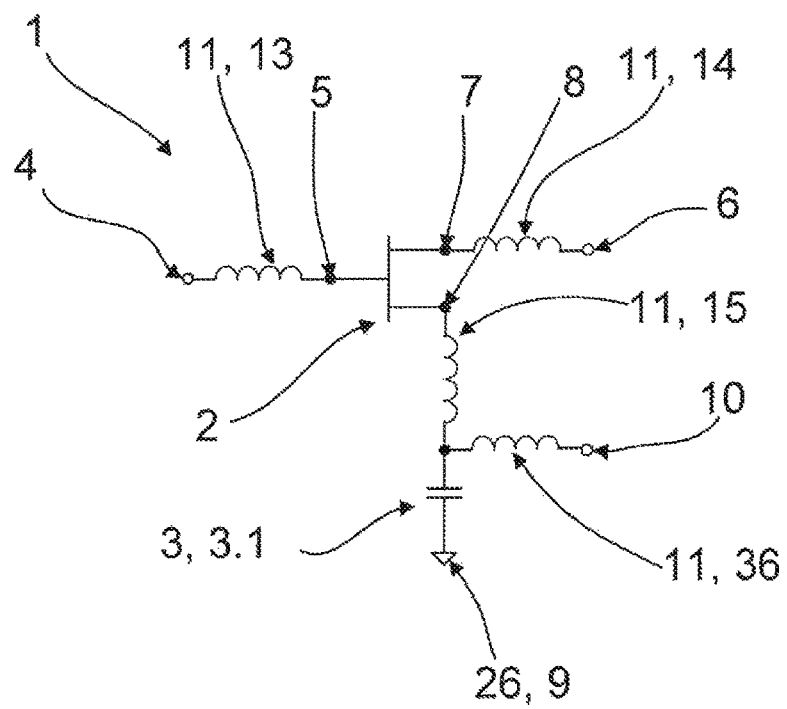
FIG. 5B is an electrical equivalent circuit diagram of the embodiment of the HF power transistor according to the invention from FIG. 5A.

FIGS. 5A and 5B are physical and electrical equivalent circuit diagrams of the embodiment of the HF power transistor 1 shown on FIG. 3A, wherein the electrical connections are established by the bond wires 36, 13, 14, 15 shown on FIG. 5A, which in turn comprise the inductances shown on FIG. 5B. The HF bypass network 3.1 depicted on FIG. 3A is formed by the capacitor 3 shown on 5A and 5B, which in turn represents a discrete, bondable one- or multilayer capacitor. Instead of a capacitor 3, use can also be made of several capacitors connected in parallel, which are placed next to each other in the housing 12. The embodiment according to the invention of the HF bypass network 3.1 depicted on FIG. 5A is formed by a short-circuit capacitor 3 to system ground 26, which has optimal properties at the HF carrier frequency, and is connected by bond wires 15, 11 with the transistor 2 and the DC & LF ground port 10. The size of the resultantly introduced inductances 15, 11 contributes to the HF insulation and LF bandwidth of the diplexer 30. The small inductance 15, 11 together with the short circuit capacitor 3 constitutes an optimal HF bypass 3.1 to the system ground 26. In another embodiment of the HF power transistor according to the invention, as shown on FIG. 4A, the entire functionality of the DC & LF/HF diplexer 30 is incorporated into the transistor housing 12, wherein the HF bypass network 3.1 remains unchanged, but an additional inductance 36, 11 between the upper electrode of the capacitor 3, which is connected with the source contact 8, and the DC & LF ground connection 10 is inserted into the housing 12. This inductance 36, 11 must have the corresponding size to realize a good HF insulation and LF bandwidth together with the inductance 15, 11. According to the invention, this additional inductance 36, 11 can be achieved either by increasing the number of bond wires or inserting a discrete coil.

Figure 1A:
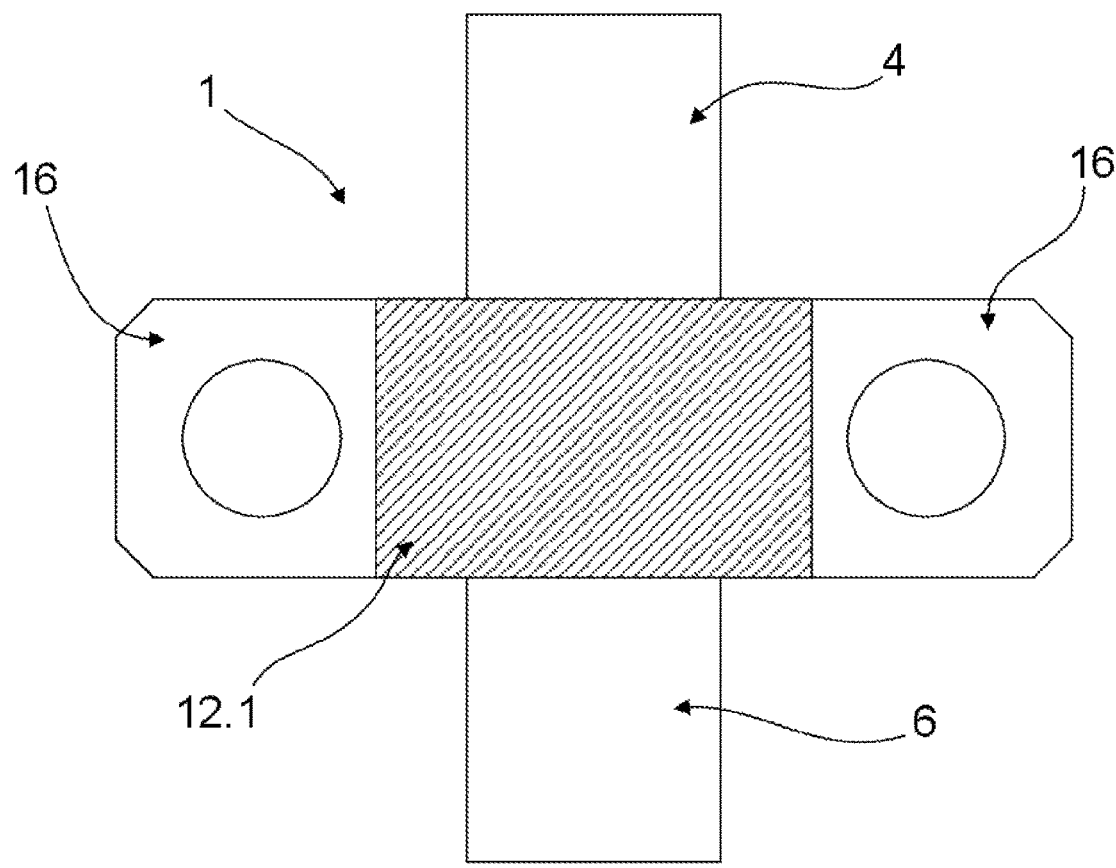
FIG. 1A is a top view of a conventional housed HF power transistor with cover.
Figure 1B:
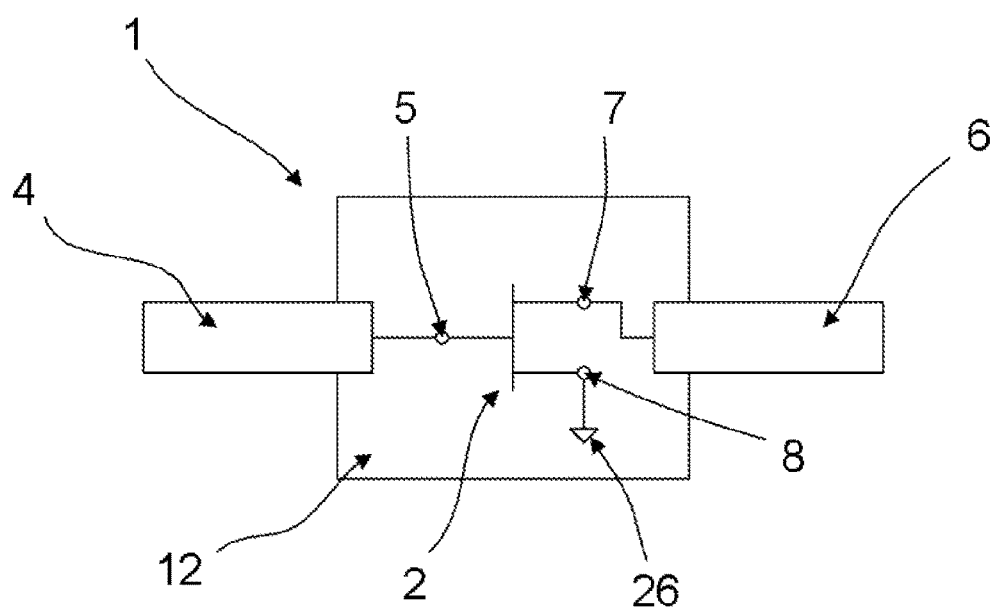
FIG. 1B is a block diagram of a housed HF power transistor known in prior art.
Figure 1C:
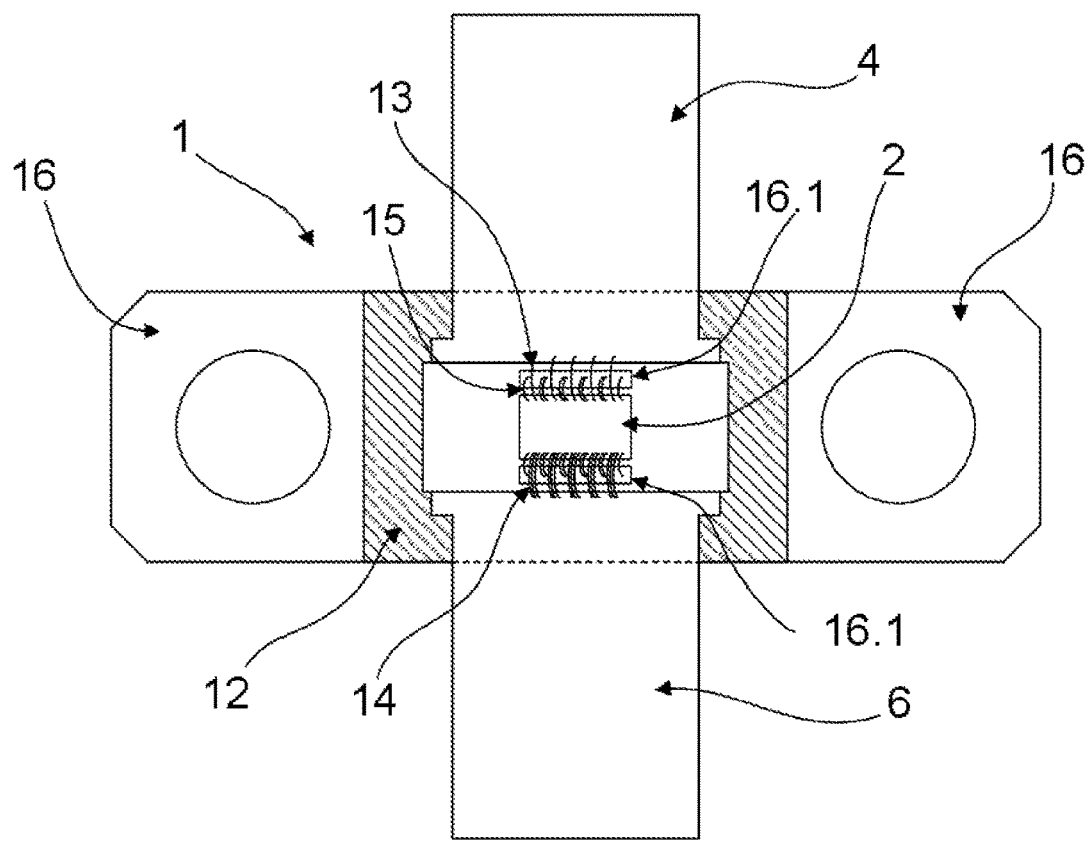
FIG. 1C is a top view of a conventional housed HF power transistor without cover, containing a transistor chip, electrically conductive bond bases and bond wires.
Figure 1D:
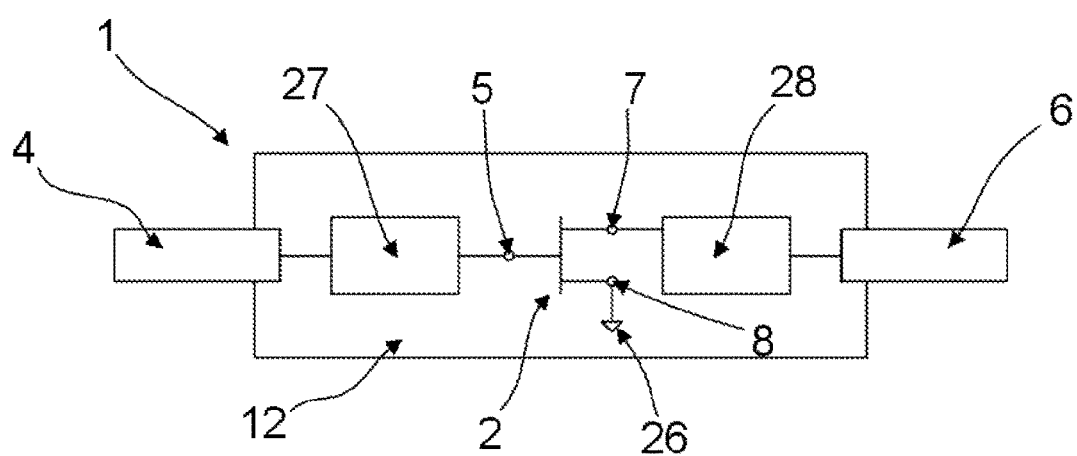
FIG. 1D is a block diagram of a conventional housed HF power transistor with input and output matching networks inside of the housing.
Figure 5C:
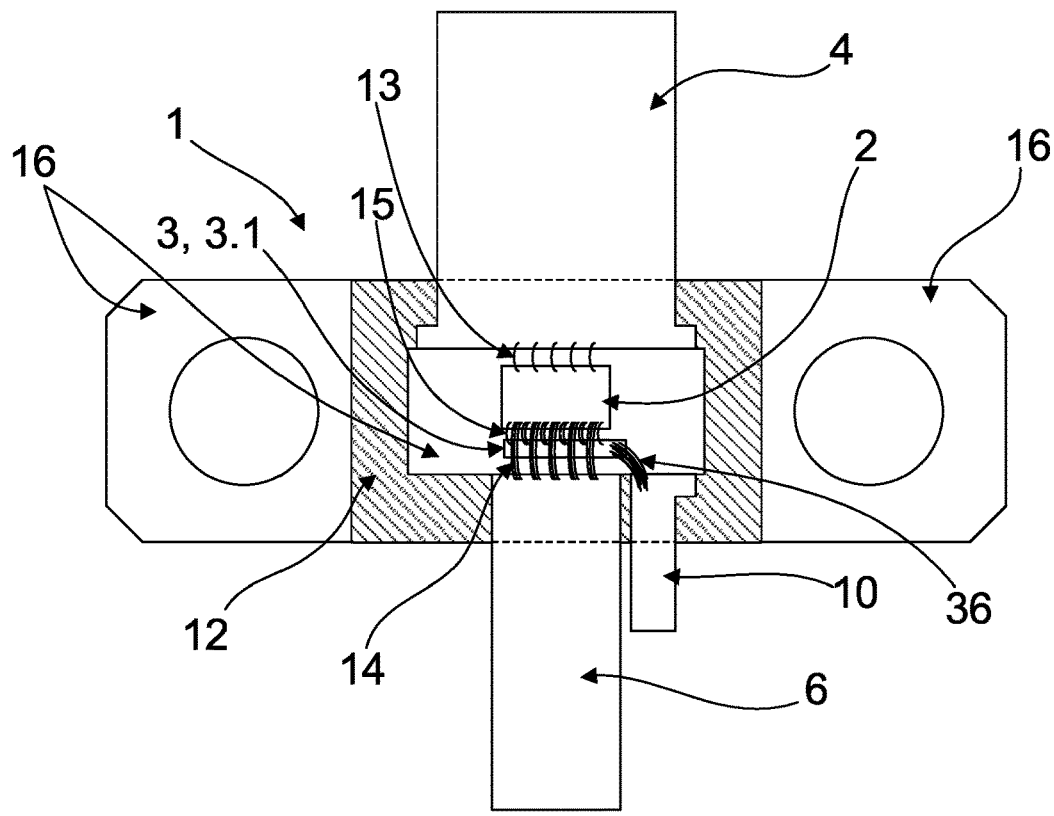
FIG. 5C is a realization example of the housed HF power transistor according to the invention with one DC & LF ground port.

FIG. 5C shows a first embodiment of the HF power transistor 1 according to the invention. The shown HF power transistor housing 12 is similar to the one shown on FIGS. 1A-C, and comprises a flange 16 with a high electrical and thermal conductivity, a ceramic frame of the housing 12 mounted thereon, which insulates the three electrical ports 4, 6, 10 in turn mounted thereon from the flange 16. The transistor 2 contained in the housing 12 is placed together with a bondable, one-layer capacitor 3 on the flange 16 inside of the ceramic frame of the housing 12. Bond wires 13 are used to connect the input port 4 with the gate contact 5 of the FET 2 (or the base contact of a BJT), the drain contact 7 of the FET 2 (or emitter contact of a BJT) with the upper electrode of the capacitor 3, and further with the DC & LF ground port 10. The depicted transistor chip involves a transistor without vias, so that the separation from the DC & LF/HF ground can be achieved. A ceramic cover 12.1 of the kind shown on FIG. 1A can optionally be used to protect the contents of the housing 12.

Figure 5D:
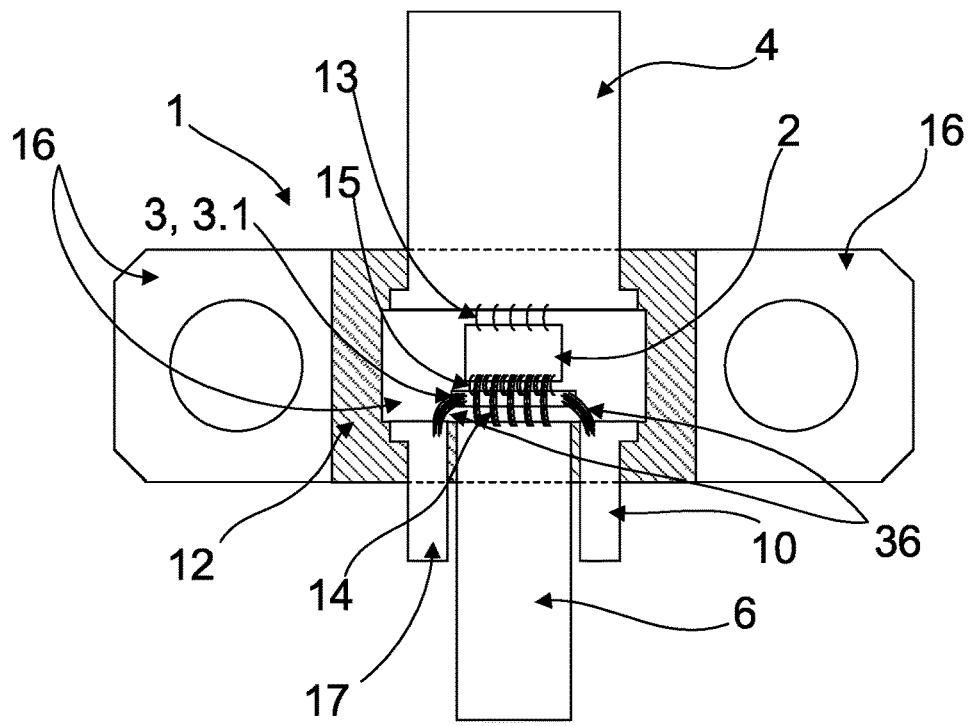
FIG. 5D is a realization example of the housed HF power transistor according to the invention with two DC & LF ground ports.

FIG. 5D shows a second embodiment of the HF power transistor 1 according to the invention, which is similar to the one on FIG. 5C, the difference being that it contains two DC & LF ground ports 10 instead of the one DC & LF ground port 10 shown on FIG. 5C, and thus also additional bond wires 36, which connect the upper electrode of the capacitor 3 with the second DC & LF ground port 10.

Figure 6A:
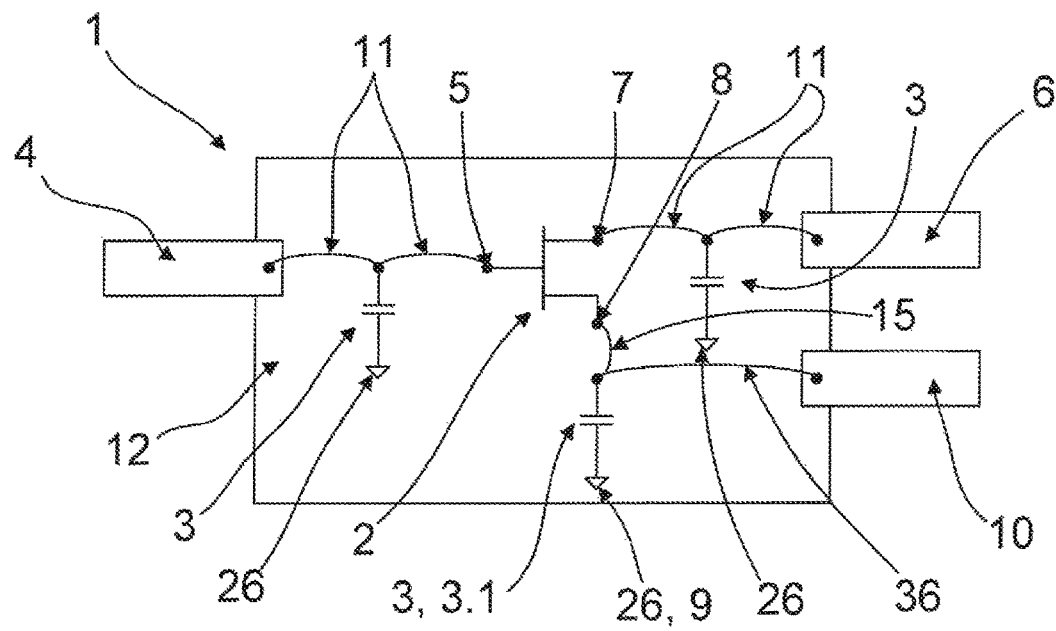
FIG. 6A is a physical equivalent circuit diagram of a further embodiment of the HF power transistor according to the invention with internal input and output matching networks.
Figure 6B:
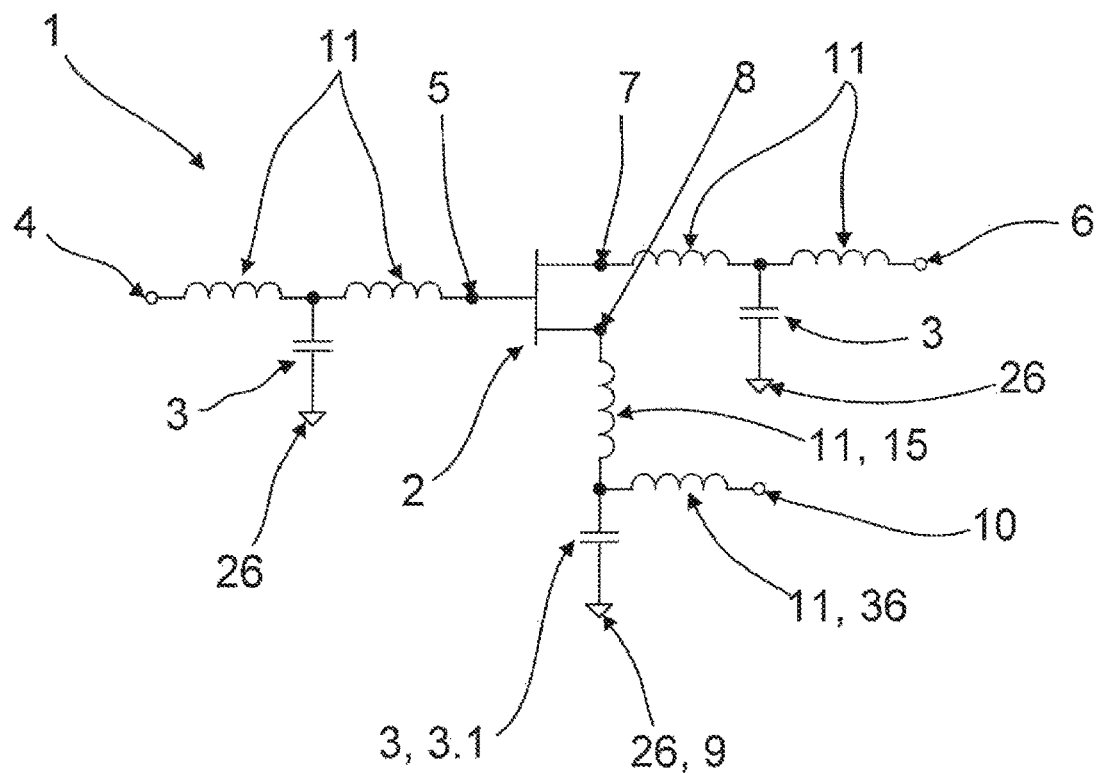
FIG. 6B is an electrical equivalent circuit diagram of the further embodiment of the HF power transistor according to the invention with internal input and output matching networks from FIG. 6A.

FIGS. 6A and 6B are physical or electrical equivalent circuit diagrams of the embodiment of the HF power transistor 1 according to the invention depicted on FIG. 3B with integrated matching networks 27, 28, wherein bond wires 36, 13, 14, 15 are used as inductive elements, and discrete one- or multilayer capacitors 3 as capacitive elements. With respect to the HF power transistor 1, the matching networks 27, 28 can be implemented on the input and/or output side. The input matching network 27 shown on FIG. 3B is realized on FIG. 6A with a discrete one- or multilayer short circuit capacitor 3, which is connected by wire bonds both with the input port 4 as well as with the gate contact 5 of the transistor 2. Several capacitors 3 connected in parallel can also be used instead of one capacitor 3. The input matching network 27 shown on FIG. 6A can be expanded by additional stages in the form of inductive and/or capacitive elements. The output matching network 28 shown on FIG. 3B is realized on FIG. 6A with a discrete one- or multilayer short circuit capacitor 3, which is connected by wire bonds both with the drain contact 7 of the transistor 2 as well as with the output port 6. Several capacitors 3 connected in parallel can also be used instead of one capacitor 3. The output matching network 28 shown on FIG. 6A can be expanded by several stages in the form of inductive and/or capacitive elements. The HF bypass network 3.1 shown on FIG. 3B is realized on FIG. 6A with a one- or multilayer capacitor 3, which has optimal properties at the HF carrier frequency. The upper electrode of the capacitor 3 is connected by bond wires 15 with the source contact 8 of the transistor 2. The lower electrode of the capacitor 3 is directly connected with the flange 16 of the transistor housing 12, which constitutes the system or HF ground 9, 26. In a typical embodiment, the inductances 36 and 15 constitute the inductances of the bond wires 36, 15 used for the electrical connections. At the same time, their size contributes to the HF insulation and LF bandwidth of the diplexer 30. The small inductance 15 together with the short circuit capacitor 3 constitutes an optimal HF bypass 3.1 to the system ground 26. In a further embodiment of the HF power transistor according to the invention, as shown on FIG. 4B, the entire functionality of the DC & LF/HF diplexer 30 is incorporated into the transistor housing 12, wherein the HF bypass network 3.1 remains unchanged, but an additional inductance 36, 11 between the upper electrode of the capacitor 2, which is connected with the source contact 8, and the DC & LF ground connection 10 is inserted into the housing 12. This inductance 36, 11 must have the corresponding size to realize a good HF insulation and LF bandwidth together with the inductance 15, 11. According to the invention, this additional inductance 36, 11 can be achieved either by increasing the number of bond wires or inserting a discrete coil.

Figure 7A:
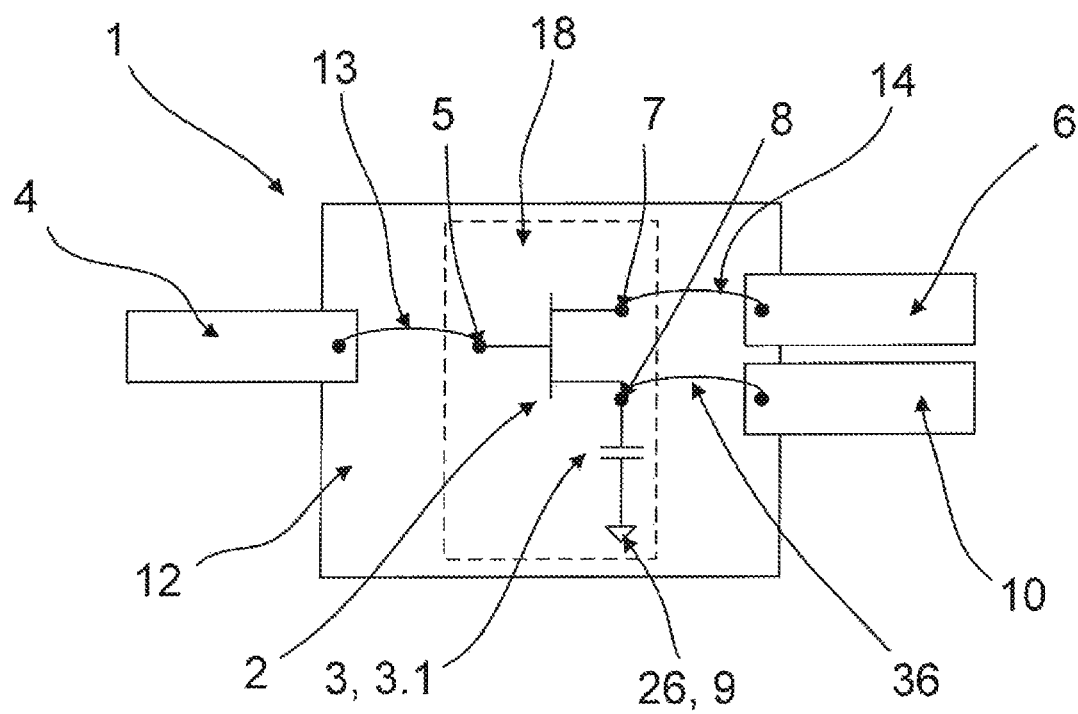
FIG. 7A is a physical equivalent circuit diagram of a further embodiment of the HF power transistor according to the invention, in which the HF bypass network to the system ground is realized on the same chip as the transistor.
Figure 7B:
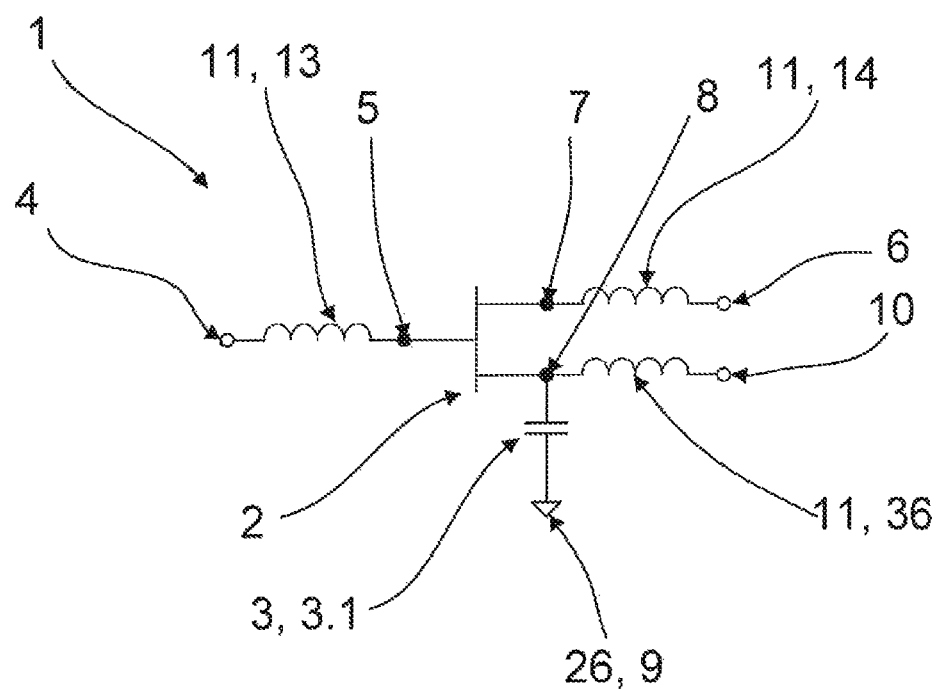
FIG. 7B is an electrical equivalent circuit diagram of the further embodiment of the HF power transistor according to the invention, in which the HF bypass network to the system ground is realized on the same chip as the transistor, from FIG. 7A.

FIGS. 7A and 7B are physical or electrical equivalent circuit diagrams of a further embodiment of the HF power transistor 1 according to the invention based on FIG. 3A, which are similar to the one on FIGS. 5A and 5B, but in which the HF bypass capacitor 3.1 is realized as a metal insulator metal (MIM) capacitor 3 on the same chip 18 as the transistor 2. This minimizes the inductive component of the HF bypass network 3.1, and further improves the HF insulation and LF bandwidth.

Figure 7C:
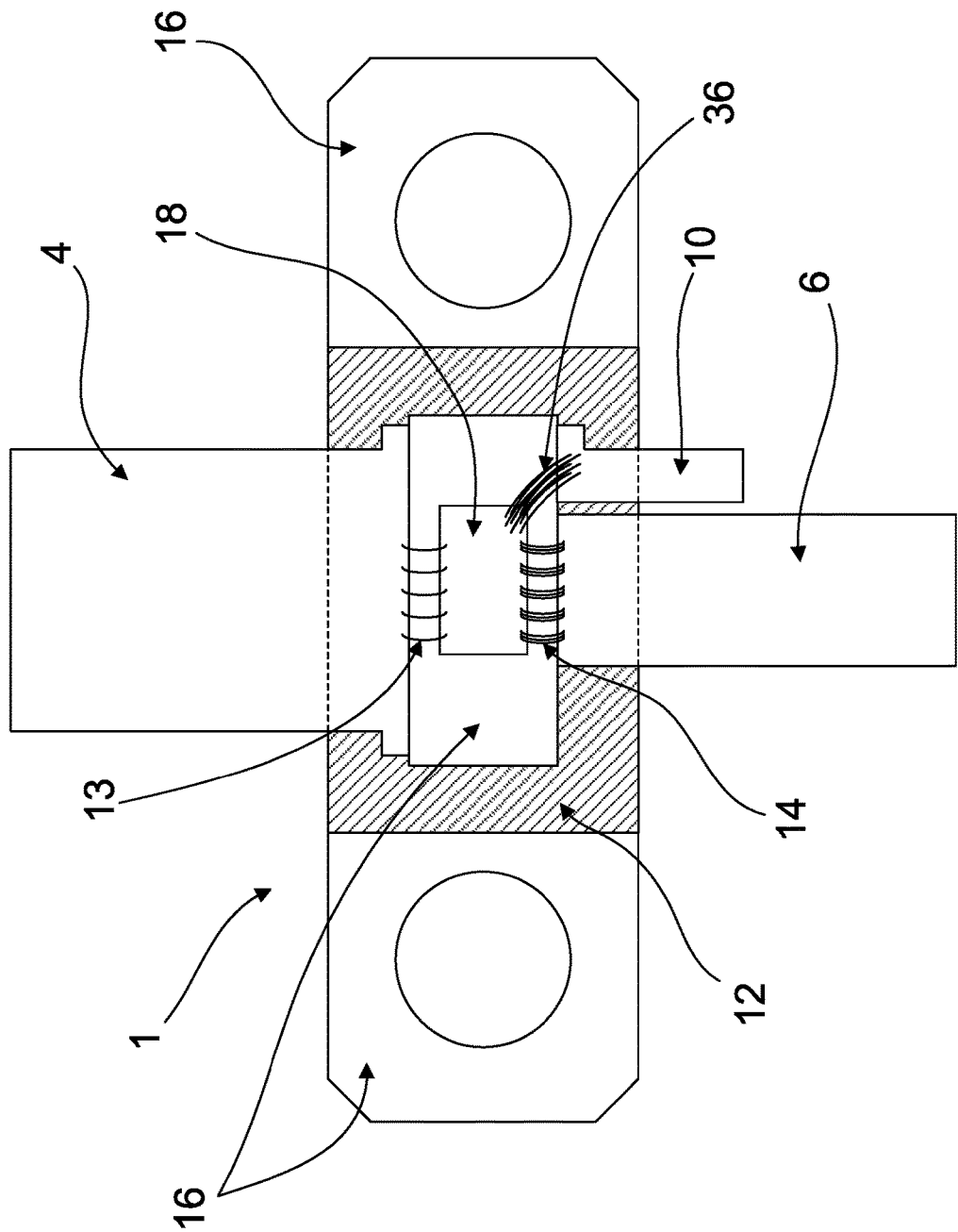
FIG. 7C is a realization example of the housed HF power transistor according to the invention with a DC & LF ground port.

FIG. 7C shows a third embodiment of the HF power transistor 1 according to the invention according to FIGS. 7A and 7B, which is similar to the one on FIG. 5C, the difference being that a transistor with integrated MIM capacitor according to FIGS. 7A and 7b is placed in the housing 12 instead of the transistor chip with a separate capacitor 3. As a consequence, the number of required bond wires is reduced in comparison to FIG. 5C.

Figure 8:
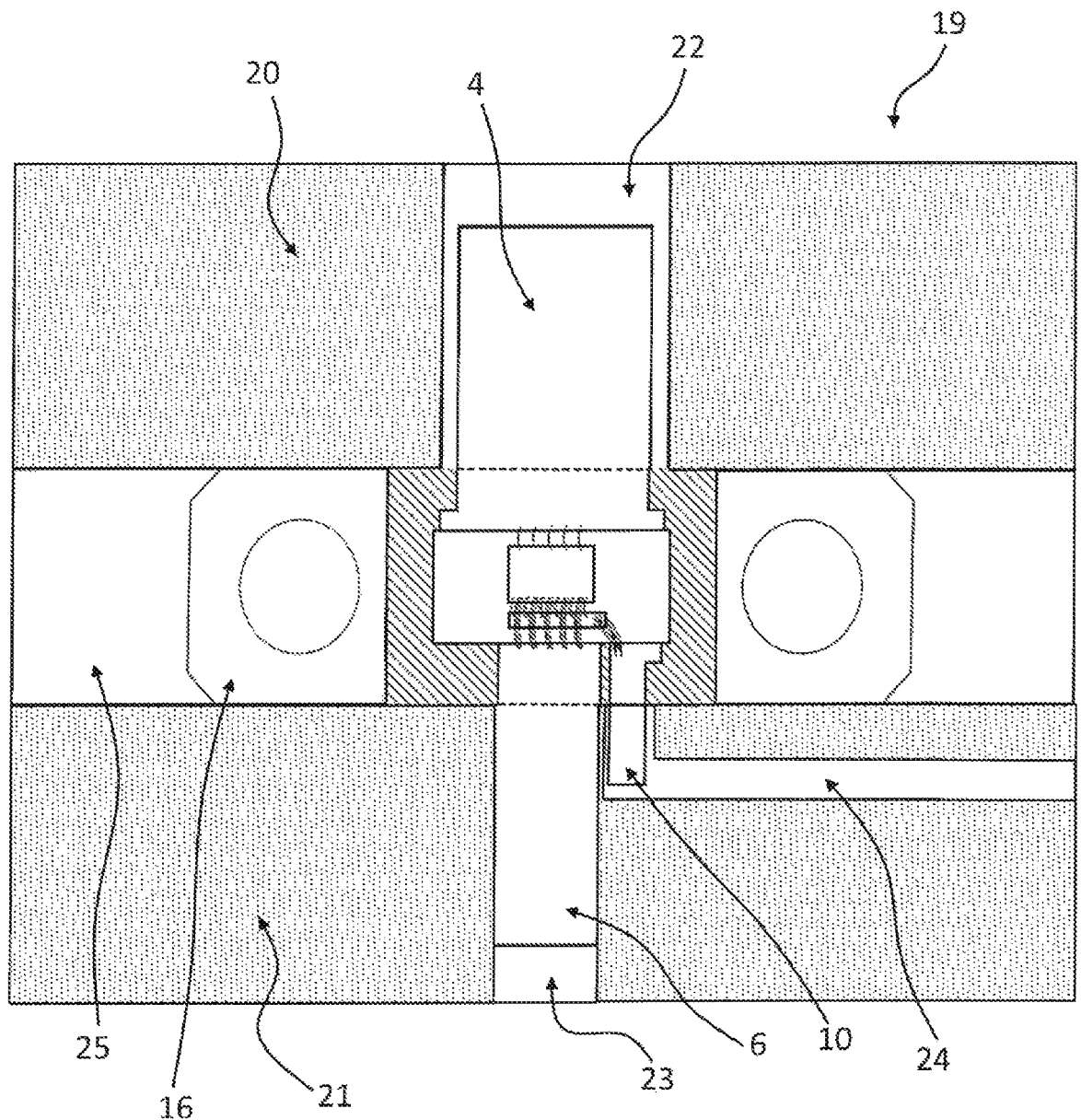
FIG. 8 is an embodiment of an HF power transistor according to the invention according to FIG. 5C with surrounding printed circuit boards.

FIG. 8 shows an embodiment of an HF power transistor 1 according to the invention according to the embodiment on FIG. 5C, and two printed circuit boards 20, 21 arranged on opposing sides of the high-frequency power transistor 1. The first port 4 is connected to a conductor path 22 of the first printed circuit board 20. The second port 6 and the fourth port (and possibly the fifth port 17, not shown here) are connected to corresponding conductor paths 23, 24 of the second printed circuit board 21. The conductor paths 22, 23, 24 of the printed circuit boards 20, 21 provide the external connections for the first, second, fourth and possibly the fifth (or additional) ports 4, 6, 10, 17.

The third port 9 is connected via at least one flange 16 to a heatsink 25 of the high-frequency power transistor 1, which defines the system ground for the high-frequency power amplifier. While the power transistor 1 is here depicted based on the example of the power transistor 1 on FIG. 5C, the expert can readily glean corresponding embodiments for the power transistors 1 on FIGS. 5D and 7C.

Figure 8A:
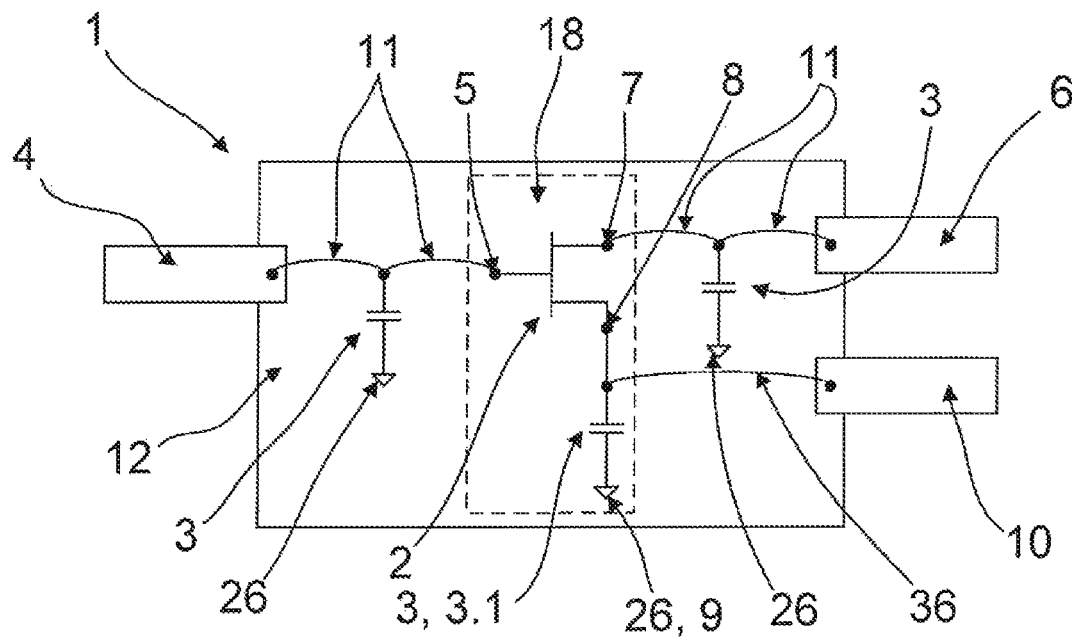
FIG. 8A is a physical equivalent circuit diagram of a further embodiment of the HF power transistor according to the invention with internal input and output matching networks, in which the HF bypass network to the system ground is realized on the same chip as the transistor.
Figure 8B:
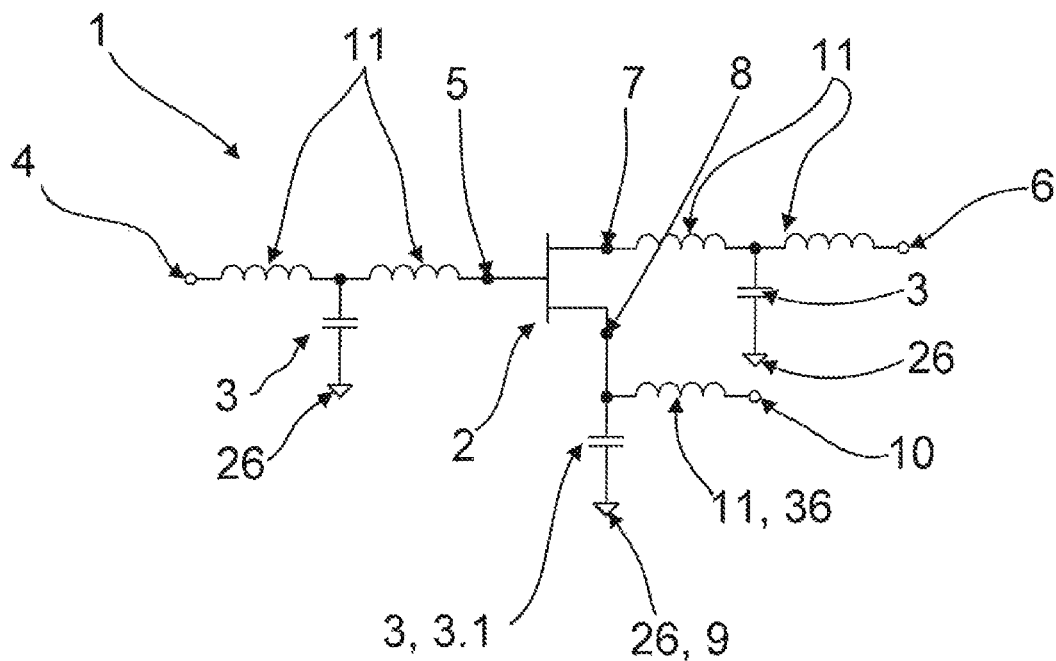
FIG. 8B is an electrical equivalent circuit diagram of the further embodiment of the HF power transistor according to the invention with internal input and output matching networks, in which the HF bypass network to the system ground is realized on the same chip as the transistor, from FIG. 8A.

FIGS. 8A and 8B are physical and electrical equivalent circuit diagrams of another embodiment of the HF power transistor 1 according to the invention depicted by FIG. 3B, which are similar to FIGS. 6A and 6B, but in which the HF bypass capacitor 3 is realized as a metal insulator metal (MIM) capacitor on the same chip 18 as the transistor 2. This minimizes the inductive component of the HF bypass network 3.1 and further improves the HF insulation and LF bandwidth.

The input matching network 27 shown on FIG. 3B is realized on FIG. 8A with a discrete one- or multilayer short circuit capacitor 3, which is connected by wire bonds both with the input port 4 as well as with the gate contact 5 of the transistor 2. Several capacitors connected in parallel can also be used instead of one capacitor 3. The input matching network 27 shown on FIG. 8A can be expanded by additional stages in the form of inductive and/or capacitive elements. The output matching network 28 shown on FIG. 3B is realized on FIG. 8A with a discrete one- or multilayer short circuit capacitor 3, which is connected by wire bonds both with the drain contact 7 of the transistor 2 as well as with the output port 6. Several capacitors connected in parallel can also be used instead of one capacitor 3. The output matching network 28 shown on FIG. 8A can be expanded by additional stages in the form of inductive and/or capacitive elements. In another embodiment of the HF power transistor 1 according to the invention, the input 27 and/or output matching network 28 are realized on the same chip 18 as the transistor 2 by connecting MIM capacitors 3 on the chip 18 with the gate 5 or drain contact 7, and by wire bonds with the input 4 or output ports 6 of the transistor housing 12.

Figure 9A:
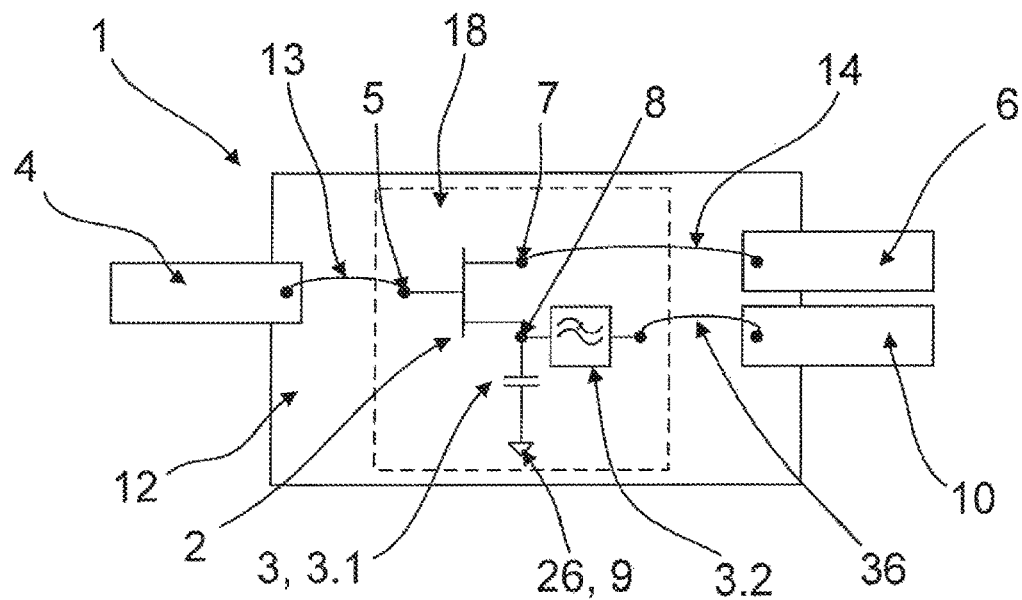
FIG. 9A is a physical equivalent circuit diagram of a further embodiment of the HF power transistor according to the invention, in which the HF bypass network to the system ground and the DC & LF lowpass network to the DC & LF port are realized on the same chip as the transistor.

FIG. 9A is the physical equivalent circuit diagram of a further embodiment of the HF power transistor 1 according to the invention depicted by FIG. 4A, which is similar to the embodiments on FIGS. 7A and 7B, but in which the function of the DC & LF lowpass filter 3.2 is not realized by the number and length of the used bond wires between the source contact 8 and the DC & LF ground port 10, but rather by inserting a suitable filter structure 3.2 on the transistor chip 18.

Figure 9B:
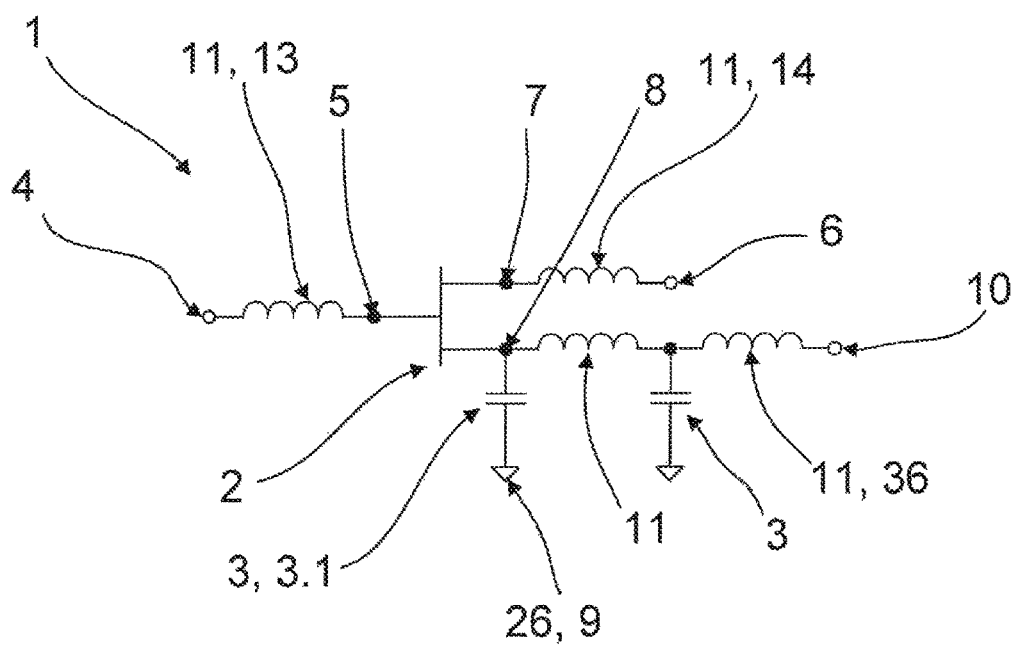
FIG. 9B is an electrical equivalent circuit diagram of the further embodiment of the HF power transistor according to the invention, in which the HF bypass network to the system ground and the DC & LF lowpass network to the DC & LF port are realized on the same chip as the transistor, from FIG. 9A.
Figure 9C:
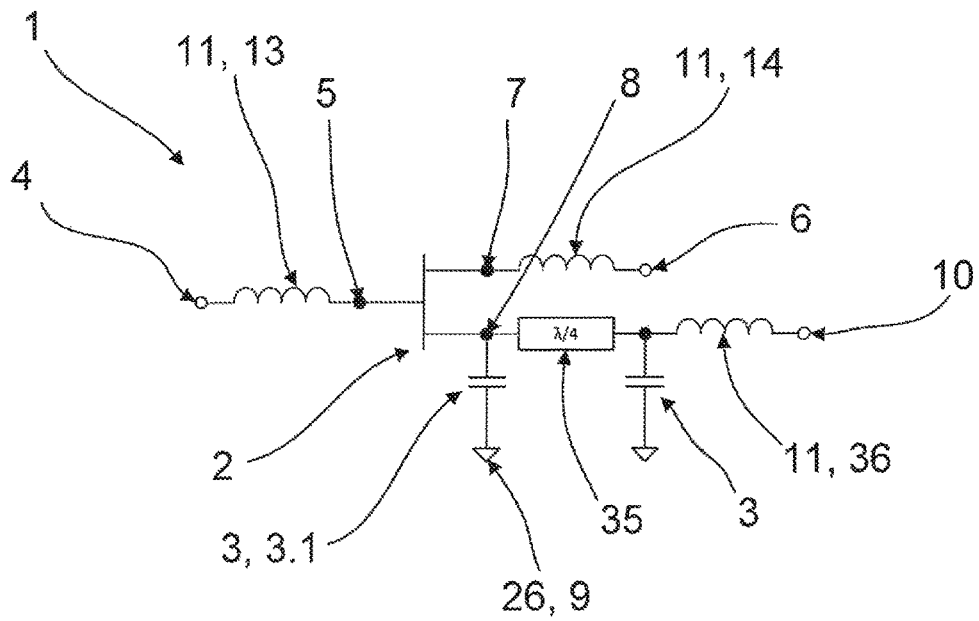
FIG. 9C is an electrical equivalent circuit diagram of a further embodiment of the HF power transistor according to the invention, in which the HF bypass network to the system ground and a short-circuited λ/4 line to the DC & LF port are realized on the same chip as the transistor.

FIGS. 9B and 9C are electrical equivalent circuit diagrams of two embodiments of the HF power transistor 1 according to the invention on FIG. 9A. On FIG. 9B, the filter structure 3.2 is realized by an inductive-capacitive (LC) filter on the transistor chip 18. The DC & LF connection between the chip 18 and the DC & LF ground port 10 is realized by wire bonds. In another embodiment of the HF power transistor 1 according to the invention, the LC filter 3.2 is realized on a separate chip, which is connected by wire bonds both with the source contact 8 of the transistor 2 as well as with the DC & LF ground port 10. On FIG. 9C, the HF insulation and LF bandwidth of the filter structure 3.2 is improved by implementing as the filter a λ/4 line 35 short circuited with a capacitor as the DC & LF line on the same chip 18 as the transistor 2, which is connected by wire bonds 36, 11 with the DC & LF ground port 10. In another embodiment of the HF power transistor 1 according to the invention, the short-circuited λ/4 line 35 is realized on a separate chip, which is connected by wire bonds both with the source contact 8 of the transistor 2 as well as with the DC & LF ground port 10. In another embodiment of the HF power transistor 1 according to the invention, input 27 and/or output matching networks 28 are mounted in the transistor housing 12 in addition to the transistor chip 18 with integrated DC & LF/HF diplexer 30, wherein the input matching network 27 is realized with a discrete one- or multilayer short circuit capacitor 3, which is connected by wire bonds both with the input port 4 as well as with the gate contact 5 of the transistor 2, and the output matching network 28 is realized with a discrete one- or multilayer short circuit capacitor 3, which is connected by wire bonds both with the drain contact 7 of the transistor as well as with the output port 6. Several capacitors connected in parallel can also be used instead of one capacitor 3 for both matching networks 27, 28. Both matching networks 27, 28 can be expanded by several stages in the form of inductive and/or capacitive elements. In another embodiment of the HF power transistor 1 according to the invention, the input 27 and/or output matching network 28 are realized on the same chip 18 as the transistor 2 by connecting MIM capacitors on the chip 18 with the gate 5 or drain contact 7, and by via wire bonds with the input 4 or output ports 6 of the transistor housing 12.

Figure 10:
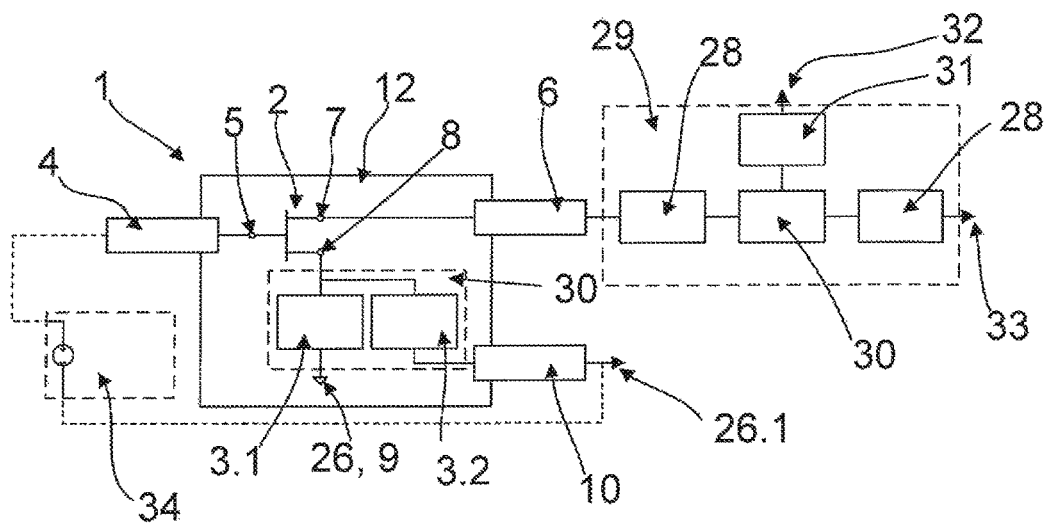
FIG. 10 is a block diagram of an embodiment of the floating, housed HF power transistor according to the invention from FIG. 4A, connected with a printed circuit board, which contains matching networks as well as the DC & LF/HF diplexer for transistor drain supply with connected supply network, as well as an additional external circuit for the galvanically separated gate supply of the transistor that is necessary for floating operation.

FIG. 10 is a block diagram of an embodiment of the floating, housed HF power transistor 1 according to the invention from FIG. 4A surrounded by a printed circuit board 29, which contains matching networks 28 as well as the DC & LF diplexer 30 for the drain supply of the transistor 1 with connected supply network 31, as well as an additional external circuit for the galvanically separate gate supply 34 of the transistor 1, which is necessary for floating operation. FIG. 10 illustrates the advantages of the invention by comparison to prior art.

Even though the invention was illustrated and described in greater detail by preferred exemplary embodiments, the invention is not limited by the disclosed examples, and other variations can be derived from this by the expert without departing from the protective scope of the invention.

All inductive elements 11 are preferably designed as bond wires.

REFERENCE LIST

1 High-frequency power transistor
2 Transistor
3 Capacitor
3.1 Bypass network
3.2 Lowpass network
4 First port (input port)
5 Gate contact
6 Second port (output port)
7 Drain contact
8 Source contact
9 Third port (HF ground connection)
10 Fourth port (DC & LF ground port)
11 Inductive element
12 Housing
12.1 Cover
13 Bond wires
14 Bond wires
15 Bond wires
16 Flange
16.1 Bond base
17 Fifth port
18 Integrated power circuit
19 Cutout of a high-frequency power amplifier: high-frequency power transistor with surrounding boards
20 Printed circuit board
21 Printed circuit board
22 Conductor path
23 Conductor path
24 Conductor path
25 Heat sink
26 Ground
26.1 DC & LF ground
27 Input matching network
28 Output matching network
29 Board
30 Diplexer
31 DC & LF supply network
32 DC & LF supply
33 HF output
34 Galvanically separate gate supply
35 λ/4-line
36 Bond wires

The invention claimed is:

1. A high-frequency power transistor comprising:
a transistor,
at least one capacitor,
a housing, which at least partially encloses the transistor and the capacitor,
wherein a first port for a high-frequency input and a gate DC voltage supply are connected to a gate contact of the transistor,
a second port is connected to a drain contact of the transistor for a high-frequency output and drain DC voltage supply, and
wherein a third port and a fourth port are connected to a source contact of the transistor, and
wherein the first, second, third and fourth port all lead out of the housing, and
wherein the third port is connected via the capacitor to the source contact, and the fourth port is connected via at least one inductive element to the source contact, so that the third port provides a high-frequency ground, and the fourth port provides a floating low-frequency ground and source DC voltage supply, wherein
the inductive element comprises a bond wire or several bond wires connected in parallel, which form a lowpass network between the fourth port and the source contact.

2. The high-frequency power transistor according to claim 1, wherein the capacitor is a one-layer capacitor.

3. The high-frequency power transistor according to claim 1, wherein the high-frequency power transistor comprises at least two capacitors connected in parallel between the third port and the source contact.

4. The high-frequency power transistor according to claim 1, wherein the transistor and the capacitor are combined in an integrated power circuit.

5. The high-frequency power transistor according to claim 4, wherein the integrated power circuit is an MMIC.

6. The high-frequency power transistor according to claim 1, wherein the third port is connected with at least one electrically conductive flange.

7. The high-frequency power transistor according to claim 1, wherein the high-frequency power transistor comprises a fifth port, which is connected via at least one inductive element to the source contact, so that the third port provides a high-frequency ground, and the fourth port and the fifth port together provide a floating DC & LF ground and source DC voltage supply.

8. The high-frequency power transistor according to claim 1, wherein two printed circuit boards are arranged on opposing sides of the high-frequency power transistor.

9. The high-frequency power transistor according to claim 8,
wherein the first port is connected to a conductor path of the first printed circuit board, and
wherein the second port, the fourth port, as well as possibly the fifth port are connected to conductor paths of the second printed circuit board.

10. The high-frequency power transistor according to claim 8, wherein the third port, is connected to a heatsink of the high-frequency power amplifier, which defines the system ground for the high-frequency power amplifier.

11. The high-frequency power transistor according to claim 9, wherein the third port, is connected to a heatsink of the high-frequency power amplifier, which defines the system ground for the high-frequency power amplifier.

* * * * *